United States Patent
Lu et al.

(10) Patent No.: US 9,635,781 B2
(45) Date of Patent: Apr. 25, 2017

(54) HEAT DISSIPATING DEVICE AND ELECTRONIC APPARATUS

(71) Applicant: DELTA ELECTRONICS, INC., Taoyuan Hsien (TW)

(72) Inventors: Chao-Wen Lu, Taoyuan Hsien (TW); Chun-Chih Wang, Taoyuan Hsien (TW); Ding-Wei Chiu, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 136 days.

(21) Appl. No.: 14/463,275

(22) Filed: Aug. 19, 2014

(65) Prior Publication Data

US 2015/0177795 A1    Jun. 25, 2015

(30) Foreign Application Priority Data

Dec. 24, 2013    (TW) .............................. 102147877 A

(51) Int. Cl.
*G06F 1/20* (2006.01)
*H05K 7/20* (2006.01)

(52) U.S. Cl.
CPC ......... *H05K 7/20136* (2013.01); *G06F 1/203* (2013.01); *H05K 7/2049* (2013.01); *H05K 7/20154* (2013.01)

(58) Field of Classification Search
CPC ........... H05K 7/20136; H05K 7/20154; H05K 7/20172; G06F 1/20–1/203; G06F 2200/201; H01L 23/433–23/4332; H01L 23/4338

USPC .................... 361/679.48, 694–695; 165/80.2
See application file for complete search history.

(56) References Cited

U.S. PATENT DOCUMENTS

| | | | | |
|---|---|---|---|---|
| 6,029,742 | A * | 2/2000 | Burward-Hoy | F28D 1/0325 165/80.3 |
| 7,131,487 | B2 * | 11/2006 | Chang | F28D 15/02 165/104.33 |
| 7,277,291 | B2 | 10/2007 | Ross et al. | |
| 7,793,709 | B2 * | 9/2010 | Mukasa | H02K 33/18 165/121 |
| 8,520,383 | B2 * | 8/2013 | Park | F04D 33/00 165/121 |
| 2005/0074662 | A1 * | 4/2005 | Cho | F04F 7/00 454/184 |
| 2006/0245163 | A1 * | 11/2006 | Mukasa | G06F 1/20 361/701 |
| 2006/0281398 | A1 * | 12/2006 | Yokomizo | G06F 1/203 454/184 |

(Continued)

*Primary Examiner* — Zachary M Pape
*Assistant Examiner* — Amir Jalali
(74) *Attorney, Agent, or Firm* — Muncy, Geissler, Olds & Lowe, P.C.

(57) ABSTRACT

A heat dissipating device for dissipating the heat produced by a heating element is disclosed. The heat dissipating device includes a fixing assembly, two moving assemblies and an elastic assembly. The fixing assembly has a thermal conductive member. Each moving assembly has a mass body and is relatively moveable with respect to the fixing assembly. The two moving assemblies are disposed on two opposite sides of the fixing assembly, respectively, and each moving assembly forms a moving space with respect to the fixing assembly. The elastic assembly connects the fixing assembly to the two moving assemblies.

13 Claims, 7 Drawing Sheets

(56) References Cited

U.S. PATENT DOCUMENTS

| | | | |
|---|---|---|---|
| 2009/0050292 A1* | 2/2009 | Yu | H01L 23/427 165/80.2 |
| 2009/0086416 A1* | 4/2009 | Ishikawa | F04F 7/00 361/679.01 |
| 2009/0219686 A1* | 9/2009 | Ishikawa | F04F 7/00 361/692 |
| 2011/0277968 A1* | 11/2011 | Chao | F04B 43/043 165/120 |
| 2012/0051058 A1* | 3/2012 | Sharma | F04B 43/046 362/294 |
| 2013/0301218 A1* | 11/2013 | Li | F04D 33/00 361/695 |
| 2014/0049970 A1* | 2/2014 | de Bock | H01L 41/0926 362/373 |
| 2014/0226282 A1* | 8/2014 | Tang | H05K 7/20136 361/694 |
| 2014/0376185 A1* | 12/2014 | Lee | H01L 23/467 361/694 |
| 2015/0152858 A1* | 6/2015 | Cheng | F04B 45/04 416/3 |
| 2015/0173241 A1* | 6/2015 | Hsu | H05K 7/20209 165/287 |
| 2015/0181331 A1* | 6/2015 | Kim | H04R 3/00 381/162 |

\* cited by examiner

HEAT DISSIPATING DEVICE AND ELECTRONIC APPARATUS

CROSS REFERENCE TO RELATED APPLICATIONS

This Non-provisional application claims priority under 35 U.S.C. §119(a) on Patent Application No(s). 102147877 filed in Taiwan, Republic of China on Dec. 24, 2013, the entire contents of which are hereby incorporated by reference.

BACKGROUND OF THE INVENTION

Field of Invention

The present invention relates to a heat dissipating device.

Related Art

As the progress of information and technology, various kinds of electronic apparatuses or devices have been developed toward smaller size and lighter weight. In general, the processor of electronic device will generate heat during operation. The common desktop computer or laptop computer usually uses a fan for active heat dissipation. On the contrary, the small-sized tablet computer is usually equipped with a simpler processor, which has lower performance and thus generates much less heat. Accordingly, the tablet computer can dissipate the heat generated from the processor by a passive approach such as a heat sink or a heat pipe. Otherwise, a thin fan is applied to the small-sized electronic device for heat dissipation. Unfortunately, the fan still has the noise issue. Besides, the bearing of the fan may be damaged after operating for years, which limits the lifespan of the fan as well as the duration of the electronic apparatus.

Except the fan, the most commonly used heat dissipating approach for a small-sized apparatus is jet flow heat dissipation. Typically, the jet flow heat dissipation utilizes membrane vibration to generate airflow instead of rotating blades of a fan. In more detailed, the jet flow heat dissipating device has a chamber structure in cooperating with a vibration membrane, and the vibration membrane compresses the space of the chamber structure so as to generate the desired airflow. However, the chamber structure design increases the difficulty of minimization and flattening of the jet flow heat dissipating device. Besides, when the space of the chamber structure is compressed, the internal air pressure of the chamber structure increases. This operation will cause the vibration of the entire jet flow heat dissipating device, thereby generating the vibration noise.

Therefore, it is an important subject to provide a heat dissipating device and an electronic apparatus that can be applied to small-sized electronic products. Moreover, it is also desired to provide a novel design for reducing the fault rate of the heat dissipating device, thereby improving the duration, extending the lifespan and decreasing the noise.

SUMMARY OF THE INVENTION

In view of the foregoing subject, an objective of the invention is to provide a heat dissipating device and an electronic apparatus that can be applied to small-sized electronic products and reduce the fault rate of the heat dissipating device by the novel design, thereby improving the duration, extending the lifespan and decreasing the noise.

To achieve the above objective, the present invention discloses a heat dissipating device for dissipating the heat produced by a heating element. The heat dissipating device includes a fixing assembly, two moving assemblies and an elastic assembly. The fixing assembly has a thermal conductive member. Each moving assembly has a mass body and is relatively moveable with respect to the fixing assembly. The two moving assemblies are disposed on two opposite sides of the fixing assembly, respectively, and each moving assembly forms a moving space with respect to the fixing assembly. The elastic assembly connects the fixing assembly to the two moving assemblies.

In one embodiment, the thermal conductive member is connected to the heating element and conducts the heat of the heating element to the fixing assembly.

To achieve the above objective, the present invention also discloses an electronic apparatus, which includes a heating element and a heat dissipating device. The heat dissipating device includes a fixing assembly, two moving assemblies and an elastic assembly. The fixing assembly has a thermal conductive member connecting to the heating element for conducting heat produced by the heating element to the fixing assembly. Each moving assembly has a mass body and is relatively moveable with respect to the fixing assembly. The two moving assemblies are disposed on two opposite sides of the fixing assembly, respectively, and each moving assembly forms a moving space with respect to the fixing assembly. The elastic assembly connects the fixing assembly to the two moving assemblies.

In one embodiment, the fixing assembly further has a coil, and each of the two moving assemblies has a magnetic member.

In one embodiment, the coil is disposed on the thermal conductive member, and the magnetic member is disposed on the mass body.

In one embodiment, one of the moving assemblies has a magnetic member, and the other one of the moving assemblies has a coil.

In one embodiment, the magnetic member and the coil are disposed on the two mass bodies, respectively.

In one embodiment, the elastic assembly includes a connecting portion connecting to the fixing assembly and two elastic arms connecting to the two moving assemblies, respectively.

In one embodiment, the elastic assembly includes two elastic elements disposed at two opposite sides of the fixing assembly and connecting to the two moving assemblies, respectively.

In one embodiment, the elastic element has a connecting portion connecting to the fixing assembly and an elastic arm connecting to the mass body of the corresponding moving assembly.

In one embodiment, the mass body and the elastic element are integrally formed as one piece.

In one embodiment, the thermal conductive member includes a heat pipe.

In one embodiment, the relative moving frequency of the two moving assemblies with respect to the fixing assembly is between 20 and 60 cycles per second.

As mentioned above, the heat dissipating device of the invention has two moving assemblies disposed at two opposite sides of the fixing assembly so as to form the moving spaces, and a thermal conductive member of the fixing assembly connecting to the heating element for conducting the heat produced by the heating element to the moving spaces so as to increase the temperature inside the moving spaces. The moving assembly relatively moves with respect to the fixing assembly so as to compress the moving space, thereby ejecting the air of high temperature from the moving space to achieve the goal of heat dissipation. Besides, the elastic assembly connects the fixing assembly to the moving assemblies, so that the relative motion of the moving assemblies can be easily continued. Accordingly, the air inside the moving spaces can be stably ejected, and it is also possible to speed the heat conduction from the heating element to the moving space through the thermal conductive member, thereby enhancing the heat dissipation effect.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
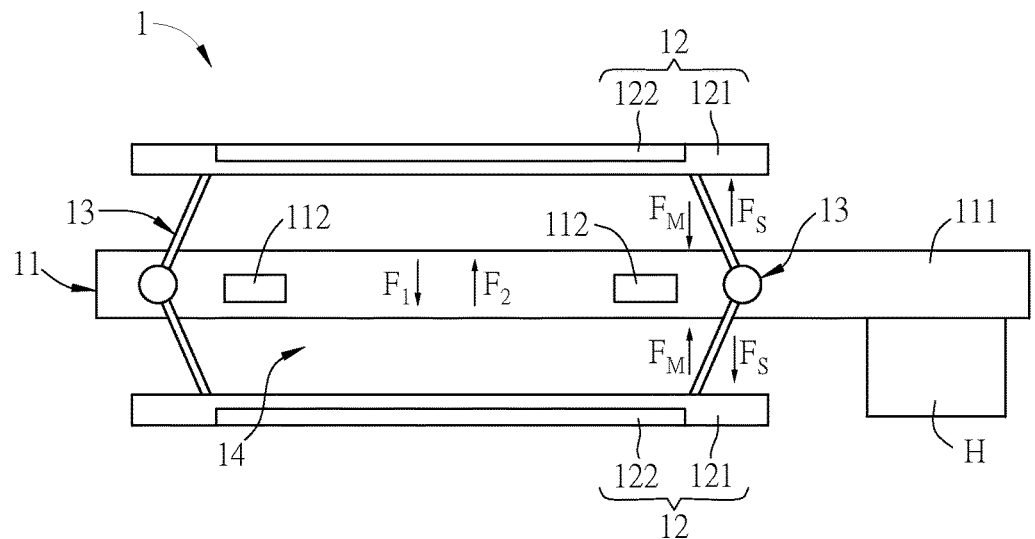
FIG. 1A is a sectional view of a heat dissipating device according to a first embodiment of the invention.

FIG. 1A is a sectional view of a heat dissipating device 1 according to a first embodiment of the invention. To be noted, FIG. 1A only shows simple blocks for representing the sectional structures of the heat dissipating device 1 as well as the components thereof, and implementation theory of the heat dissipating device 1 will be discussed with reference to FIG. 1A. Afterwards, the detailed description of the heat dissipating device 1 will be discussed later with reference to other figures (see FIGS. 2A and 2B). First of all, the heat dissipating device 1 of the first embodiment is used for dissipating the heat produced by a heating element H. For example, the heat dissipating device 1 can be applied to an electronic apparatus for dissipating the heat of the heating element H configured inside the electronic apparatus. In more detailed, as shown in FIG. 1A, the heat dissipating device 1 includes a fixing assembly 11, two moving assemblies 12 and an elastic assembly 13. The fixing assembly 11 has a thermal conductive member 111, which connects to the heating element H for conducting heat produced by the heating element H to the fixing assembly 11. The two moving assemblies 12 are disposed on two opposite sides of the fixing assembly 11, respectively. The elastic assembly 13 connects the fixing assembly 11 to the two moving assemblies 12, so that the moving assemblies 12 are relative moveable with respect to the fixing assembly 11. The term "relative moveable" represents that the moving assemblies 12 can move toward and backward the fixing assembly 11. In addition, each moving assembly 12 forms a moving space 14 with respect to the fixing assembly 11, and the moving space 14 is an open space. In practice, when the moving assemblies 12 relatively move with respect to the fixing assembly 11, the moving space 14 can be compressed and decompressed cyclically so as to eject the heated air in the moving space 14 and suck external cold air into the moving space 14.

In more specific, the fixing assembly 11 further has a coil 112, and each moving assembly 12 has a mass body 121 and a magnetic member 122. Preferably, the coil 112 is disposed on the thermal conductive member 111. In this embodiment, the coil 112 is a ring structure disposed on the thermal conductive member 111, so the sectional view thereof is illustrated as two blocks in FIGS. 1A and 1B. Of course, the number of the coil 112 is not limited in this invention. For example, in other embodiments, the fixing assembly 11 may include two coils 112 located corresponding to the moving assemblies 12 and disposed at two opposite sides of the thermal conductive member 111. Besides, the magnetic member 122 is disposed on the mass body 121 and located corresponding to the coil 112 for generating electromagnetic induction. The elastic assembly 13 connects the fixing assembly 11 to the moving assemblies 12, thereby supporting the moving assemblies 12 to maintain the moving space 14. In other words, the elastic assembly 13 provides an elastic force $F_S$ for supporting the weight of the mass body 121 and the magnetic member 122. Herein, the weight of the mass body 121 is the major part to be supported by the elastic force $F_S$. Besides, the elastic force $F_S$ can further maintain the moving space 14 between the fixing assembly 11 and the moving assembly 12. Moreover, the coil 112 may further connect to a conductive wire (not shown). Accordingly, when the current is applied to the coil 112 from the conductive wire, the magnetic member 122 is driven by the electromagnetic induction and thus carries the mass body 121 to move forth and back cyclically.

Furthermore, the magnetic member 122 is induced to generate an induction magnetic force $F_M$ toward the fixing assembly 11 (the direction toward the coil 112). If the induction magnetic force $F_M$ is larger than the elastic force $F_S$, the magnetic member 122 will carry the mass body 121 to move toward the fixing assembly 11 (see FIG. 1B which shows another status of the heat dissipating device 1). In this case, the weight of the mass body 121 also generates a force $F_W$ toward the fixing assembly 11, which compresses the elastic assembly 13 to accumulate the elastic force $F_S$. Once the elastic force $F_S$ is greater than the force $F_W$, the elastic assembly 13 will bounce back and return to the original status as shown in FIG. 1A. This movement can carry the mass body 121 to move away from the fixing assembly 11.

In other words, the induction magnetic force $F_M$ is applied to the magnetic member 122 so as to carry the mass body 121 to move toward the fixing assembly 11. This movement can compress the moving space 14 (from FIG. 1A to FIG. 1B) and thus eject the air out of the moving space 14. In practice, the voltage or current applied to the coil 112 can be properly adjusted to control the moving frequency of the moving assemblies 12 with respect to the fixing assembly 11. Preferably, the relative moving frequency of the two moving assemblies 12 with respect to the fixing assembly 11 is between 20 and 60 cycles per second. As mentioned above, the thermal conductive member 111 of the embodiment is connected to the heating element H, so that the heat of the heating element H can be conducted to the moving space 14. Accordingly, the internal temperature of the moving space 14 is higher than the outside temperature. When the moving space 14 is compressed, the internal air with higher temperature can be ejected from the moving space 14. Once the accumulated elastic force $F_S$ is larger than the force $F_W$, the elastic assembly 13 will push the mass body 121 toward the direction away from the fixing assembly (from FIG. 1B to FIG. 1A), thereby speeding the heat transfer from the heating element H to the moving space 14 through the thermal conductive member 111. In brief, this embodiment utilizes the thermal conductive member 111 to conduct the heat generated by the heating element H to the fixing assembly 11 (to the moving space 14). Afterwards, the moving assemblies 12 are driven to move toward and backward the fixing assembly 11 cyclically (the cycles of the statuses of FIGS. 1A and 1B). As a result, the internal air with higher temperature can be ejected from the moving space 14, and the heat transfer from the heating element H to the thermal conductive member 111 can be speeded, thereby achieving the desired heat dissipation purpose.

Figure 1B:
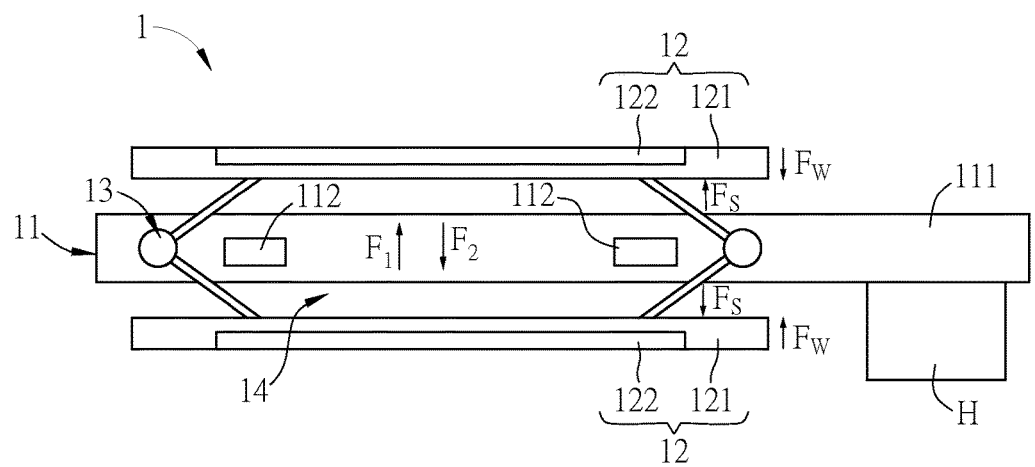
FIG. 1B is a sectional view of the heat dissipating device of FIG. 1A in another status.

In addition, the two moving assemblies 12 are located at two opposite sides of the fixing assembly 11. Thus, when the upper moving assembly 12 moves toward the fixing assembly 11 (as shown in FIG. 1B), the fixing assembly 11 will generate a counterforce $F_1$. At the same time, when the lower moving assembly 12 moves toward the fixing assembly 11 (as shown in FIG. 1B), the fixing assembly 11 will generate another counterforce $F_2$. Since the counterforce $F_1$ and the counterforce $F_2$ have opposite directions and are substantial equivalent, they can offset against each other, thereby avoiding the vibration of the heat dissipating device 1 and decreasing the generated noise. Of course, when the moving assemblies 12 move away from the fixing assembly 11 (as shown in FIG. 1A), the generated counterforce $F_1$ and counterforce $F_2$ also have opposite directions and are substantial equivalent. So the detailed description thereof will be omitted here.

Figure 2A:
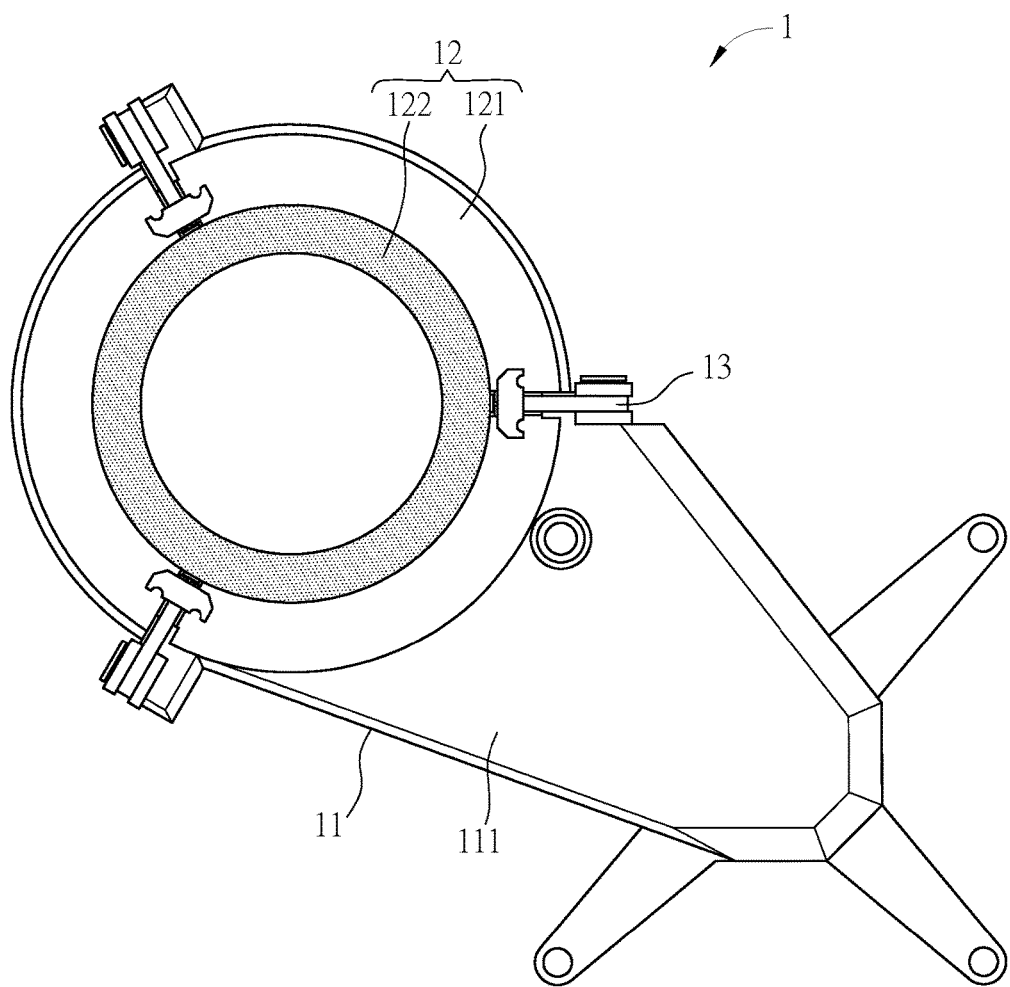
FIG. 2A is a schematic diagram showing the heat dissipating device according to the first embodiment of the invention.
Figure 2B:
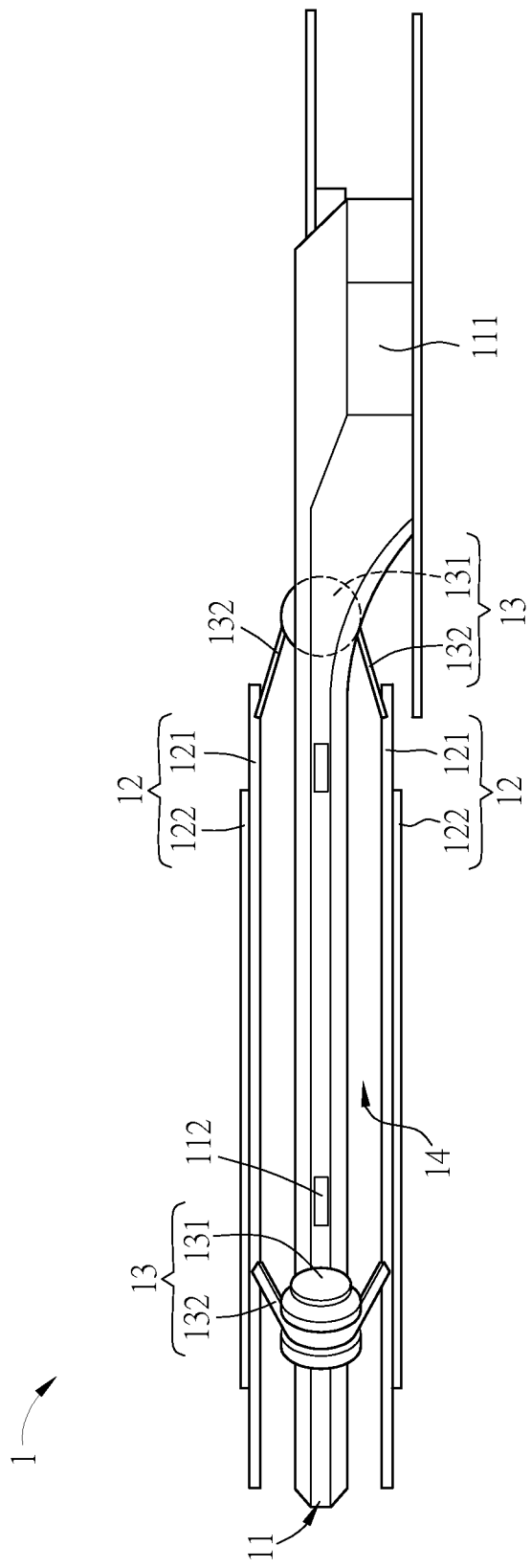
FIG. 2B is a front view of the heat dissipating device of FIG. 2A.

FIG. 2A is a schematic diagram showing the heat dissipating device 1 according to the first embodiment of the invention, and FIG. 2B is a front view of the heat dissipating device 1 of FIG. 2A. Herein, FIG. 1A only shows a simple sectional view of the heat dissipating device 1, but FIGS. 2A and 2B show more detailed perspective views of the heat dissipating device 1. Referring to FIGS. 2A and 2B, the fixing assembly 11 is mainly composed of the thermal conductive member 111, and the coil 112 is disposed inside the thermal conductive member 111. Besides, the thermal conductive member 111 is inherently configured with a lock structure for directly fixing the heating element H (see FIG. 1A), so that the heat can be conducted to the moving spaces 14 of the moving assemblies 12 configured at two opposite sides of the fixing assembly 11. Besides, the magnetic member 122 is disposed at one side of the mass body 121 so as to form the moving assembly 12. The magnetic member 122 of this embodiment is a magnetic ring. In this embodiment, three elastic assemblies 13 are disposed at the peripheries of the fixing assembly 11 and the moving assemblies 12 for connecting the fixing assembly 11 to the moving assemblies 12. The elastic assembly 13 has a connecting portion 131 and two elastic arms 132. The connecting portion 131 connects to the fixing assembly 11, and the two elastic arms 132 connect to the two moving assemblies 12, respectively. Preferably, the elastic arm 132 is disposed on the mass body 121. As mentioned above, when the current is applied to the coil 112 of the fixing assembly 11, the magnetic member 122 is driven by the electromagnetic induction and thus carries the mass body 121 to move forth and back cyclically. This movement can compress the moving spaces 14 and thus eject the air with higher temperature. The other components of the heat dissipating device 1 as well as the connections and actions thereof can be referred to the previous illustrations, so the detailed description thereof will be omitted.

To be noted, the positions of the coil and the magnetic member are not limited in this invention. In other embodiments, the coil and magnetic member can be located at the positions other than the above embodiment, and any position that can achieve the desired relative movement of the moving assemblies with respect to the fixing assembly is acceptable.

Figure 3A:
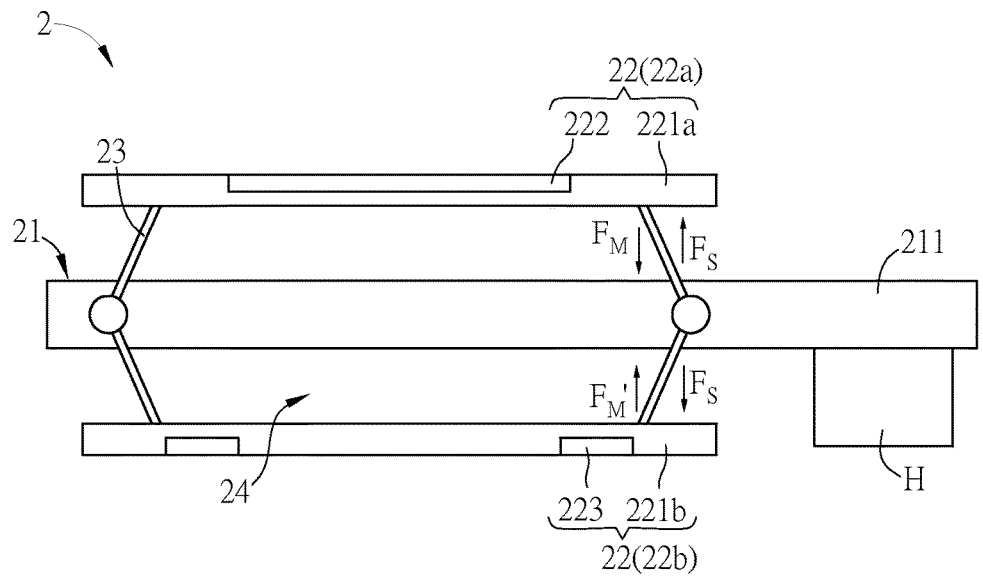
FIG. 3A is a sectional view of a heat dissipating device according to a second embodiment of the invention.

FIG. 3A is a sectional view of a heat dissipating device 2 according to a second embodiment of the invention. To be noted, FIG. 3A only shows simple blocks for representing the sectional structures of the heat dissipating device 2 as well as the components thereof, and the detailed description of the heat dissipating device 2 will be discussed later with reference to other figures (see FIGS. 4A to 4C). As shown in FIG. 3A, the heat dissipating device 2 of the second embodiment also includes a fixing assembly 21, two moving assemblies 22 and an elastic assembly 23. The thermal conductive member 211 of the fixing assembly 21 connects to the heating element H, and the two moving assemblies 22 are disposed on two opposite sides of the fixing assembly 21, respectively. The elastic assembly 23 connects the fixing assembly 21 to the two moving assemblies 22, so that the moving assemblies 22 are relative moveable with respect to the fixing assembly 21, thereby compressing the moving spaces 24 so as to achieve the heat dissipation purpose. In this embodiment, one of the moving assemblies 22 has a magnetic member 222, and the other one of the moving assemblies 22 has a coil 223. Similarly, the coil 223 of this embodiment is a ring structure, so the sectional view thereof is illustrated as two blocks in FIGS. 3A and 3B. To make the following descriptions more clear, the moving assembly 22 configured with the magnetic member 222 is named as a first moving assembly 22a, while the other moving assembly 22 configured with the coil 223 is named as a second moving assembly 22b. Herein, the first moving assembly 22a has a mass body 221a, and the second moving assembly 22b has a mass body 221b.

Figure 3B:
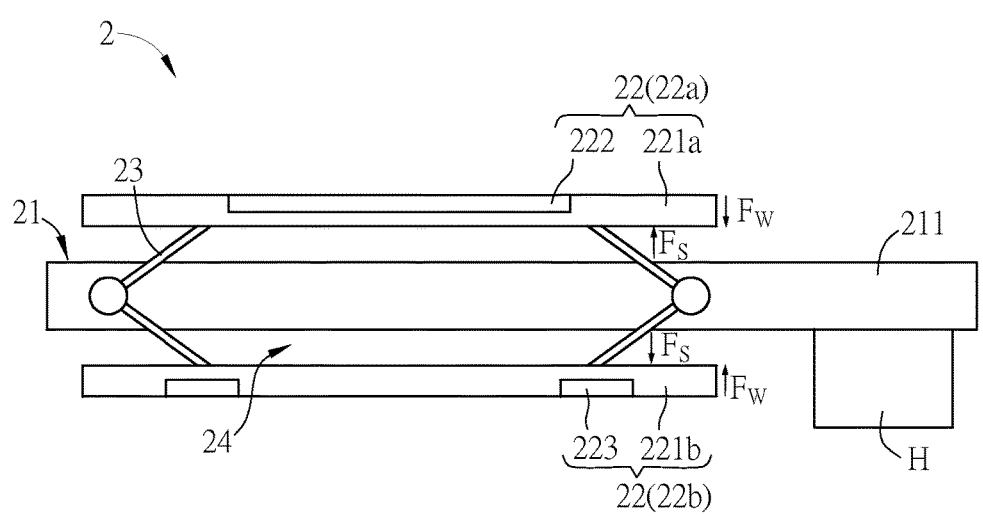
FIG. 3B is a sectional view of the heat dissipating device of FIG. 3A in another status.

In other words, the magnetic member 222 and the coil 223 of the second embodiment are disposed at different mass bodies 221a and 221b, respectively. This configuration can also achieve the purpose that the first moving assembly 22a and the second moving assembly 22b relatively move with respect to the fixing assembly 21. Furthermore, the coil 223 may further connect to a conductive wire (not shown). Accordingly, when the current is applied to the coil 223 from the conductive wire, the electromagnetic induction is generated between the magnetic member 222 and the coil 223. Then, the magnetic member 222 is affected by the electromagnetic induction and thus generates an induction magnetic force $F_M$ toward the coil 223. If the induction magnetic force $F_M$ is larger than the elastic force $F_S$, the magnetic member 222 will carry the mass body 221a to move toward the coil 223 as well as the fixing assembly 21. Besides, the coil 223 is also affected by the electromagnetic induction and generates an induction magnetic force $F_M'$ toward the magnetic member 222. If the induction magnetic force $F_M'$ is larger than the elastic force $F_S$, the mass body 221b configured with the coil 223 can be pushed to move toward the magnetic member 222 as well as the fixing assembly 21. In other words, the first moving assembly 22a and the second moving assembly 22b of the heat dissipating device 2 are affected by the electromagnetic induction and moved toward the fixing assembly 21 so as to compress the moving spaces 24 (see FIG. 3B). Herein, FIG. 3B is a sectional view of the heat dissipating device 2 of FIG. 3A in another status. The motion from FIG. 3A to FIG. 3B can eject the air with higher temperature from the moving spaces 24.

As mentioned above, the weight of the mass bodies 221a and 221b also generate a force $F_W$ toward the fixing assembly 21. Once the elastic force $F_S$ is greater than the force $F_W$, the elastic assembly 23 will bounce back and carry the mass bodies 221a and 221b to move away from the fixing assembly 21 (back to the status as shown in FIG. 3A). This movement can speed the heat transfer from the heating element H to the moving space 24 through the thermal conductive member 211, thereby achieving the desired purpose of heat dissipation. Other detailed motions and actions of the heat dissipating device 2 can be referred to the heat dissipating device 1 of the first embodiment, so the detailed description thereof will be omitted here.

Figure 4A:
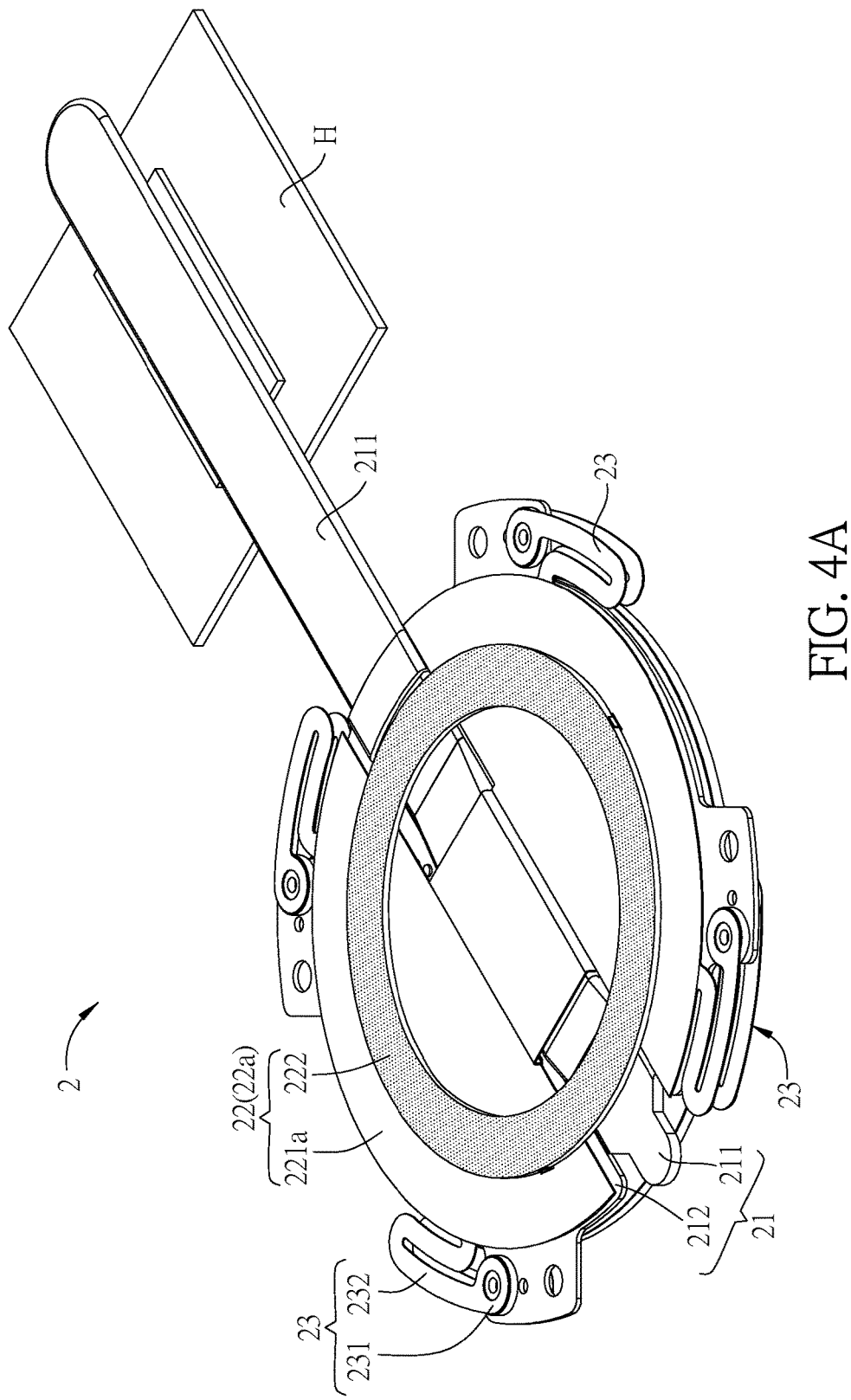
FIG. 4A is a schematic diagram showing the heat dissipating device of FIG. 3A.
Figure 4B:
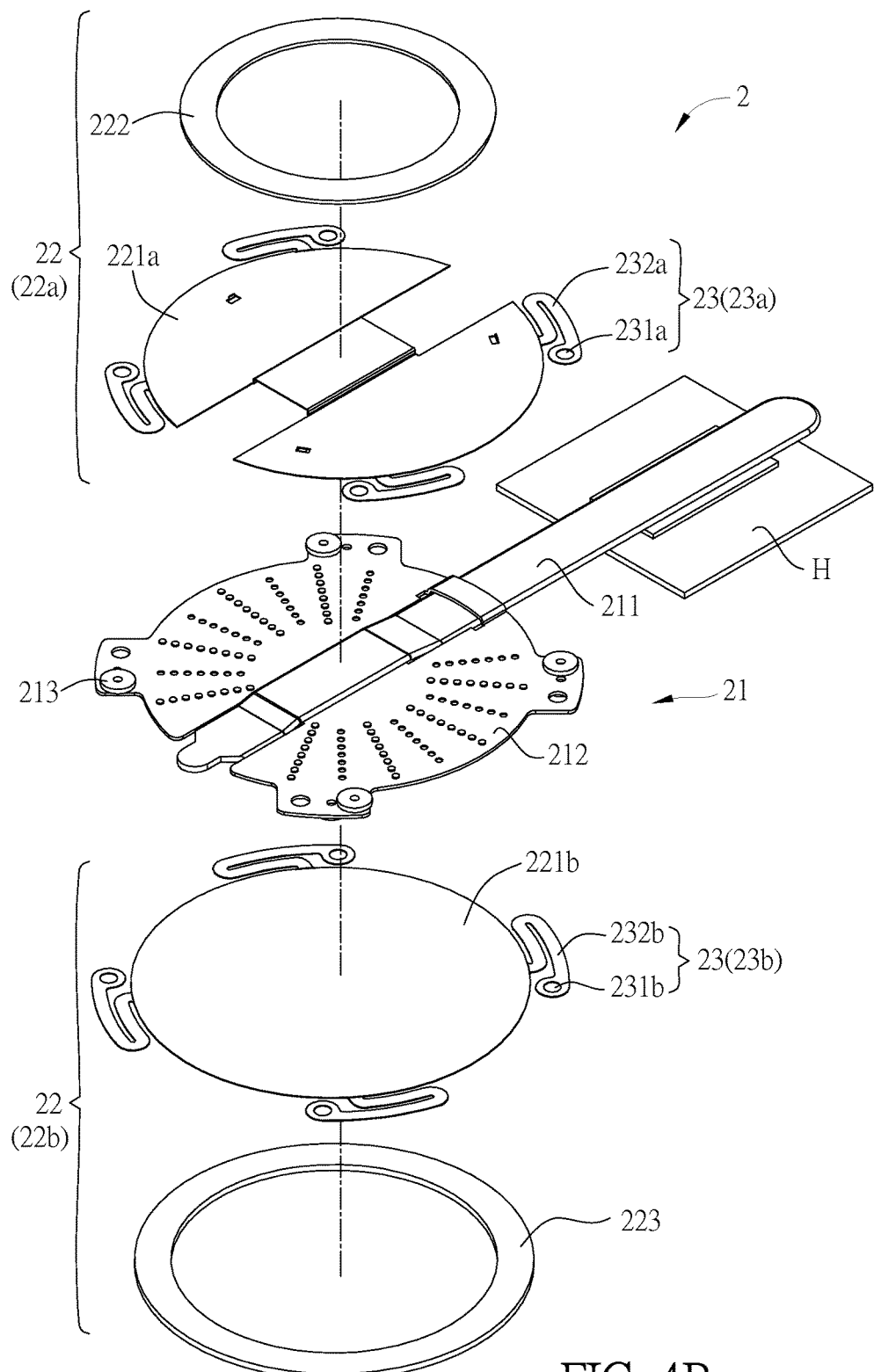
FIG. 4B is an exploded view of the heat dissipating device of FIG. 4A.
Figure 4C:
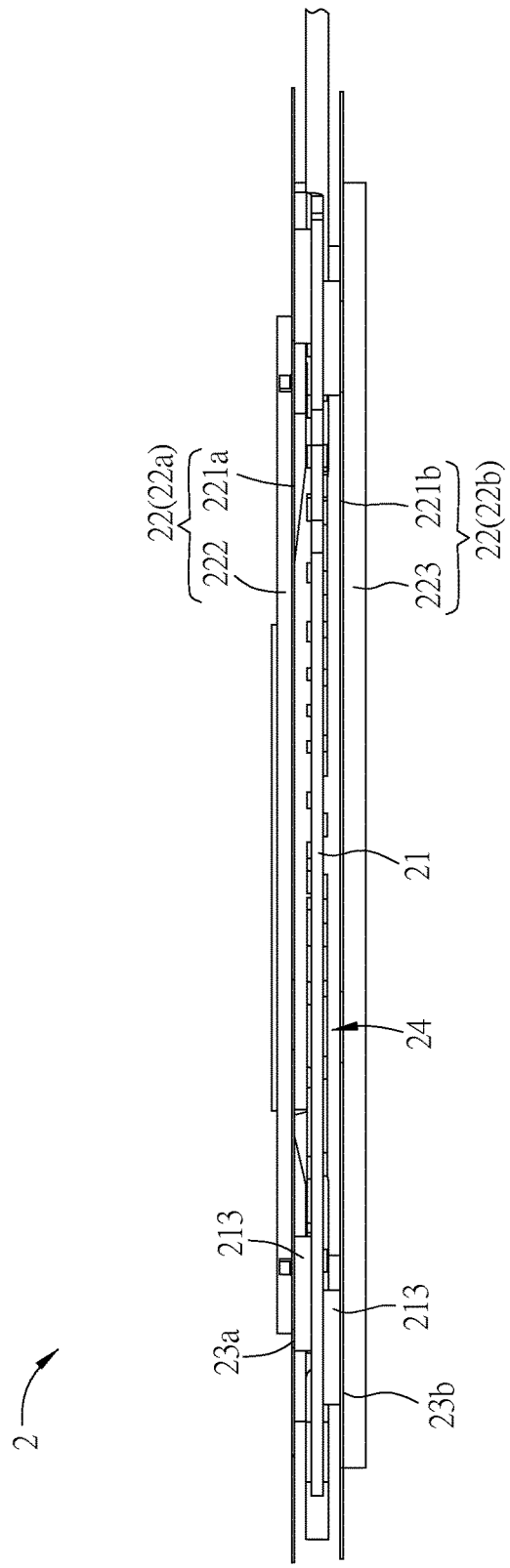
FIG. 4C is a front view of the heat dissipating device of FIG. 4A.

FIG. 4A is a schematic diagram showing the heat dissipating device 2 of FIG. 3A, FIG. 4B is an exploded view of the heat dissipating device 2 of FIG. 4A, and FIG. 4C is a front view of the heat dissipating device 2 of FIG. 4A. Herein, FIGS. 3A and 3B only show simple sectional views of the heat dissipating device 2, but FIGS. 4A to 4C show more detailed perspective views of the heat dissipating device 2. Referring to FIGS. 4A and 4B, the fixing assembly 21 is mainly composed of a thermal conductive member 211 and a heat-dissipating member 212. Preferably, the thermal conductive member 211 is a heat pipe. Wherein, one end of the thermal conductive member 211 is connected to the heating element H, and the other end thereof is connected to the heat-dissipating member 212. The first moving assembly 22a and the second moving assembly 22b are located at two opposite sides of the heat-dissipating member 212. In other words, the two moving assemblies 22 are located at two opposite sides of the fixing assembly 21, thereby forming a moving space 24 together. In this embodiment, the thermal conductive member 211 and the heat-dissipating member 212 can cooperate to speed the heat transfer from the heating element H to the moving space 24. In addition, the magnetic member 222 and the coil 223 are disposed on the mass body 221a of the first moving assembly 22a and the mass body 221b of the second moving assembly 22b, respectively.

In this embodiment, four elastic assemblies 23 are symmetrically configured on the fixing assembly 21, the first moving assembly 22a and the second moving assembly 22b for connecting the fixing assembly 21 to the first moving assembly 22a and the second moving assembly 22b. Herein, the elastic assembly 23 includes two elastic member 23a and 23b, which are disposed at two opposite sides of the fixing assembly 21 and connected to two moving assemblies 22 (the first moving assembly 22a and the second moving assembly 22b), respectively. The elastic assembly 23 has a connection portion 231 and an elastic arm 232. In more detailed, the elastic member 23a includes a connection portion 231a and an elastic arm 232a, and the elastic member 23b includes a connection portion 231b and an elastic arm 232b. The connection portions 231a and 231b are connected to the fixing assembly 21. Preferably, the fixing assembly 21 has corresponding locking portions 213 for bonding with the connection portions 231a and 231b. The elastic arm 232b is connected to the mass body 221b of the second moving assembly 22b. As mentioned above, when the current is applied to the coil 223 of the second moving assembly 22b, the magnetic member 222 and the coil 223 are all affected by the electromagnetic induction, thereby carrying the mass bodies 221a and 221b to move forth and back cyclically. Furthermore, this movement can compress the moving space 24 so as to eject out the air with higher temperature. Preferably, the mass body 221a and the elastic member 23a are integrally formed as one piece, and the mass body 221b and the elastic member 23b are integrally formed as one piece. That is, the elastic arms 232a and 232b are extended from the mass bodies 221a and 221b, respectively, and the connection portions 231a and 231b are fastened to the locking portions 213 of the fixing assembly 21. Accordingly, the lighter and more compact heat dissipating device 2 can be provided. The connections and actions of other components of the heat dissipating device 2 can be referred to the above embodiments, so the detailed description thereof will be omitted here.

This invention also discloses an electronic apparatus including a heating element and a heat dissipating device. The heat dissipating device includes a fixing assembly, two moving assemblies and an elastic assembly. The fixing assembly has a thermal conductive member connecting to the heating element for conducting heat produced by the heating element to the fixing assembly. Each moving assembly has a mass body and is relatively moveable with respect to the fixing assembly. The two moving assemblies are disposed on two opposite sides of the fixing assembly, respectively, and each moving assembly forms a moving space with respect to the fixing assembly. The elastic assembly connects the fixing assembly to the two moving assemblies. The components of the heat dissipating device and their connections as well as the connection of the heating element and the heat dissipating device can be referred to the above embodiments, so the detailed description thereof will be omitted here.

In summary, the heat dissipating device of the invention has two moving assemblies disposed at two opposite sides of the fixing assembly so as to form the moving spaces, and a thermal conductive member of the fixing assembly connecting to the heating element for conducting the heat produced by the heating element to the moving spaces so as to increase the temperature inside the moving spaces. The moving assembly relatively moves with respect to the fixing assembly so as to compress the moving space, thereby ejecting the air of high temperature from the moving space to achieve the goal of heat dissipation. Besides, the elastic assembly connects the fixing assembly to the moving assemblies, so that the relative motion of the moving assemblies can be easily continued. Accordingly, the air inside the moving spaces can be stably ejected, and it is also possible to speed the heat conduction from the heating element to the moving space through the thermal conductive member, thereby enhancing the heat dissipation effect.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A heat dissipating device for dissipating heat produced by a heating element, comprising:
   a fixing assembly having a non-elastic thermal conductive member connecting to the heating element;
   two moving assemblies disposed on two opposite sides of the fixing assembly, respectively, wherein each of the moving assemblies has a mass body, is relatively moveable with respect to the fixing assembly, and forms a moving space with respect to the fixing assembly, wherein the fixing assembly is disposed between the two moving assemblies; and an elastic assembly connecting the fixing assembly to the two moving assemblies to form two non-enclosed spaces.

2. The heat dissipating device of claim 1, wherein the non-elastic thermal conductive member is connected to the heating element and conducts heat of the heating element to the fixing assembly.

3. The heat dissipating device of claim 1, wherein the fixing assembly further has a coil, and each of the two moving assemblies has a magnetic member.

4. The heat dissipating device of claim 3, wherein the coil is disposed on the non-elastic thermal conductive member, and the magnetic member is disposed on the mass body.

5. The heat dissipating device of claim 1, wherein one of the moving assemblies has a magnetic member, and the other one of the moving assemblies has a coil.

6. The heat dissipating device of claim 5, wherein the magnetic member and the coil are disposed on the two mass bodies, respectively.

7. The heat dissipating device of claim 1, wherein the elastic assembly comprises a connecting portion connecting to the fixing assembly and two elastic arms connecting to the two moving assemblies, respectively.

8. The heat dissipating device of claim 1, wherein the elastic assembly comprises two elastic members disposed at two opposite sides of the fixing assembly and connecting to the two moving assemblies, respectively.

9. The heat dissipating device of claim 8, wherein the elastic member has a connecting portion connecting to the fixing assembly and an elastic arm connecting to the mass body of the corresponding moving assembly.

10. The heat dissipating device of claim 9, wherein the mass body and the elastic member are integrally formed as one piece.

11. The heat dissipating device of claim 1, wherein the non-elastic thermal conductive member comprises a heat pipe.

12. The heat dissipating device of claim 1, wherein the relative moving frequency of the two moving assemblies with respect to the fixing assembly is between 20 and 60 cycles per second.

13. An electronic apparatus, comprising:

a heating element; and a heat dissipating device, comprising:

a fixing assembly having a non-elastic thermal conductive member connecting to the heating element for conducting heat produced by the heating element to the fixing assembly, two moving assemblies disposed on two opposite sides of the fixing assembly, respectively, wherein each of the moving assemblies has a mass body, is relatively moveable with respect to the fixing assembly, and forms a moving space with respect to the fixing assembly, wherein the fixing assembly is disposed between the two moving assemblies, and an elastic assembly connecting the fixing assembly to the two moving assemblies to form two non-enclosed spaces.

\* \* \* \* \*